(12) United States Patent
Kim et al.

(10) Patent No.: US 9,379,674 B2
(45) Date of Patent: Jun. 28, 2016

(54) TRANSIMPEDANCE PRE-AMPLIFIER WITH IMPROVED BANDWIDTH

(71) Applicant: Electronics and Telecommunications Research Institute, Daejeon-si (KR)

(72) Inventors: Young-Ho Kim, Daejeon-si (KR); Sang-Soo Lee, Daejeon-si (KR)

(73) Assignee: ELECTRONICS AND TELECOMMUNICATIONS RESEARCH INSTITUTE, Daejeon-Si (KR)

( * ) Notice: Subject to any disclaimer, the term of this patent is extended or adjusted under 35 U.S.C. 154(b) by 3 days.

(21) Appl. No.: 14/218,234

(22) Filed: Mar. 18, 2014

(65) Prior Publication Data

US 2014/0292413 A1 Oct. 2, 2014

(30) Foreign Application Priority Data

Mar. 29, 2013 (KR) .................. 10-2013-0034809

(51) Int. Cl.
*H03F 3/08* (2006.01)
*H03F 1/48* (2006.01)
*H03F 1/34* (2006.01)

(52) U.S. Cl.
CPC ............... *H03F 1/483* (2013.01); *H03F 1/342* (2013.01); *H03F 3/082* (2013.01); *H03F 3/08* (2013.01); *H03F 2200/36* (2013.01)

(58) Field of Classification Search
CPC ........... H03F 1/223; H03F 3/345; H03F 3/08; H03F 3/082; H03F 3/45179; H03F 1/342; H03F 1/483; H03F 1/565; H03F 2200/108; H03F 2200/181; H03F 2200/222; H03F 2200/294; H03F 2200/451; H03F 3/195
USPC ........................... 330/85, 291, 308, 311, 310
See application file for complete search history.

(56) References Cited

U.S. PATENT DOCUMENTS

| 5,363,064 A | 11/1994 | Mikamura |
| 6,011,439 A * | 1/2000 | Colarossi et al. ............. 330/290 |
| 7,454,190 B2 * | 11/2008 | Schrodinger ................... 330/98 |
| 7,602,227 B2 | 10/2009 | Kim et al. |
| 8,692,179 B2 * | 4/2014 | Cho et al. .................. 250/214 A |

FOREIGN PATENT DOCUMENTS

| KR | 10-0127898 B1 | 10/1997 |
| KR | 10-0444911 B1 | 8/2004 |
| KR | 10-0783492 B1 | 12/2007 |

OTHER PUBLICATIONS

Rui Tao et al., "Wide-band Low-Power CMOS Transimpedance Preamplifer" IEEE MTT-S International Microwave Symposium Digest, vol. 2, pp. 983-985, Jun. 2004.

* cited by examiner

*Primary Examiner* — Khanh V Nguyen
(74) *Attorney, Agent, or Firm* — Rabin & Berdo, P.C.

(57) ABSTRACT

A transimpedance pre-amplifier (TIA) with an improved bandwidth. In the TIA, a feedback circuit is added to a regulated cascode structure to be connected in parallel, so that an input resistance value is reduced and a bandwidth is easily broadened. Alternatively, an inductor is added to the regulated cascode structure, so that an input capacitance is reduced and bandwidth is easily broadened.

17 Claims, 10 Drawing Sheets

TRANSIMPEDANCE PRE-AMPLIFIER WITH IMPROVED BANDWIDTH

CROSS-REFERENCE TO RELATED APPLICATION

This application claims the benefit under 35 U.S.C. §119(a) of Korean Patent Application No. 10-2013-0034809, filed on Mar. 29, 2013, the entire disclosure of which is incorporated herein by reference for all purposes.

BACKGROUND

1. Field

The following description relates to optical communication technology, and more particularly, to signal amplification technology.

2. Description of the Related Art

Recently, following the continued increase in data traffic of wired/wireless communication networks, communication service providers are requiring a large-scale transmission system able to accommodate the increased data traffic by expanding insufficient transmission capacity. A large-scale wired optical communication transceiver is essentially required for establishing the transmission system. The optical communication transceiver is required to develop an element with a broader bandwidth for processing a larger amount of data.

A transimpedance pre-amplifier (TIA) is an amplification circuit essentially used in an optical communication system, and is an element that uses low-noise-amplification on a weak signal that converts light into an electric current through a photodetector, such as a photodiode (PD), and transfers the amplified signal as a voltage signal to a subsequent electronic device. A bandwidth that decides an operating speed of the TIA is one of the important design parameters, and generally, a bandwidth of the TIA is designed to be about 70% to 80% of a data speed. This value takes into consideration a noise effect and inter-symbol interference (ISI). The most important parameter that restricts the bandwidth of the TIA is the parasitic capacitance value of an input. Most parasitic capacitances are parasitic capacitances of a PD, a chip pad, an electrostatic discharge circuit, and input transistors. Among such elements, an element with the greatest value is the PD, and has a value of about 300 fF to 1.5 pF.

Above all, a time constant value ($\tau$=RC) of an input is important for increasing a bandwidth. This is because the most dominant pole among the entire optical receiver is decided in an input end of the TIA. For this reason, it is impossible to perform high-speed communication of a higher frequency. Therefore, in order to overcome a large input parasitic capacitance and achieve broadband, an input impedance must be reduced. Since a capacitance of an input end is larger than other portions, by lowering a resistance of the input end, a position of a pole (1/RC) moves to a position of high frequency, thereby increasing bandwidth. Therefore, the TIA circuit's design is required to have small input resistance while obtaining larger gain.

SUMMARY

The following description relates to a transimpedance pre-amplifier (TIA) circuit for broadening a bandwidth.

In one general aspect, a TIA includes: a regulated cascode circuit configured to include an amplification unit that amplifies an input current to generate an output voltage, and a first feedback amplification unit that is connected to an input node of the amplification unit and amplifies the input current to cause a negative feedback to the amplification unit; and a second feedback amplification unit configured to receive and amplify an output of the first feedback amplification unit to again cause a positive feedback to an input node of the regulated cascode circuit, for reducing an input resistance of the regulated cascode circuit.

The amplification unit of the regulated cascode circuit may include: a current source supply transistor connected between a first ground voltage and an input node, and configured to include a gate to which a DC voltage is applied; a first NMOS transistor connected between the input node and the first resistor, and configured to include a gate connected to an output of the first feedback amplification unit; and a first resistor connected between the first NMOS transistor and the first supply voltage. The first feedback amplification unit may include: a second NMOS transistor connected between a second ground voltage and the output node of the first feedback amplification unit, and configured to have a gate connected to the input node; and a second resistor provided between a second supply voltage and the output node which is the gate node of the first NMOS transistor and the drain node the second NMOS transistor.

The second feedback amplification unit may include: a third NMOS transistor provided between a third ground voltage and a node between a PMOS transistor and a third resistor, and configured to include gate connected to an output of the first feedback amplification unit; a third resistor provided between a third supply voltage and a node between the third NMOS transistor and the PMOS transistor; and a PMOS transistor provided between the input node of the amplification unit and a fourth supply voltage, and configured to have a gate connected to drain node of the third NMOS transistor. A combination of the second NMOS transistor and the second resistor of the first feedback amplification unit may be equivalent to a negative amplifier with an amplification gain A. A combination of the third NMOS transistor, third resistor, and PMOS transistor of the second feedback amplification unit may be equivalent to a positive amplifier with an amplification gain $A_1$. A combination of the first feedback amplification unit and the second amplification unit may be equivalent to a negative amplifier with an amplification gain $A_2$.

The current source supply transistor may be a long channel and have applied thereto a DC voltage such that a constant current is supplied to the amplification unit irrespective of a level of an input current.

The TIA may further include a photodetector configured to detect an optical signal, convert the optical signal into a current signal, and supply an input current to the amplification unit.

In another general aspect, a TIA includes: a regulated cascode circuit configured to include an amplification unit that amplifies an input current to generate an output voltage, and a first feedback amplification unit that is connected to an input node of the amplification unit and amplifies the input current to cause a negative feedback to the amplification unit; and an inductor serially connected between an input node of the amplification unit and an input node of the first feedback amplification unit, for reducing an input capacitance of the regulated cascode circuit at high frequency.

The amplification unit of the regulated cascode circuit may include: a current source supply transistor connected between a first ground voltage and an input node, and configured to have a gate to which a DC voltage is applied; a first NMOS transistor connected between the input node and the first resistor, and configured to have a gate connected to an output of the first feedback amplification unit; and a first resistor connected between the first NMOS transistor and the first supply voltage. The first feedback amplification unit may include: a second NMOS transistor provided between a second ground voltage and a node between the first NMOS transistor of the amplification unit and a second resistor, and configured to have a gate connected to the input node of the feedback amplification unit; and a second resistor provided between a second supply voltage and a node that is provided between the first NMOS transistor of the amplification unit and the second NMOS transistor.

The current source supply transistor may be a long channel and have applied thereto a DC voltage such that a constant current is supplied to the amplification unit irrespective of a level of an input current.

The TIA may further include a photodetector configured to detect an optical signal, convert the optical signal into a current signal, and supply an input current to the amplification unit.

In another general aspect, a TIA includes: a regulated cascode circuit configured to include an amplification unit that amplifies an input current to generate an output voltage, and a first feedback amplification unit that is connected to an input node of the amplification unit and amplifies the input current to cause a negative feedback to the amplification unit; a second feedback amplification unit configured to receive and amplify an output of the first feedback amplification unit to again cause a positive feedback to an input node of the regulated cascode circuit, for reducing an input resistance of the regulated cascode circuit; and an inductor serially connected between an input node of the amplification unit and an input node of the first feedback amplification unit, for reducing an input resistance of the regulated cascode circuit.

Other features and aspects will be apparent from the following detailed description, the drawings, and the claims.

Figure 1:
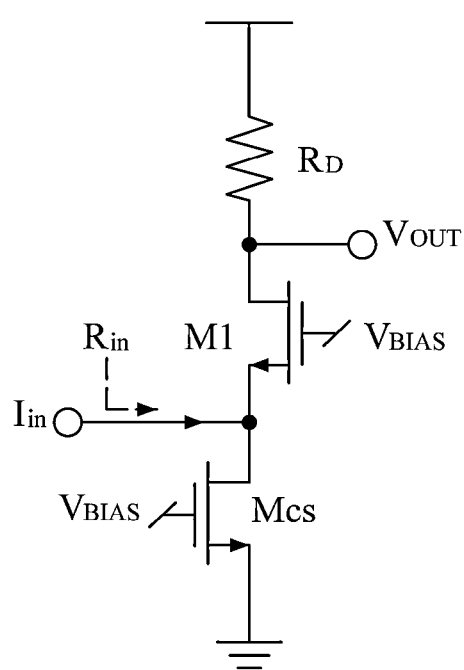
FIG. 1 is a circuit diagram illustrating a general common-gate cascode circuit.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

Hereinafter, embodiments of the present invention will be described in detail with reference to the accompanying drawings. Descriptions of well-known functions or configurations may be omitted for clarity and conciseness. In addition, while parts of the present invention are named and described below with reference to their functionalities, alternative terminology may be employed, as desired by a user, operator, or according to conventional practice, without altering the content of the disclosure.

FIG. 1 is a circuit diagram illustrating a general common-gate cascode circuit.

Referring to FIG. 1, the cascode circuit includes a plurality of transistors $M_{CS}$ and M1 and a resistor $R_D$. The cascode circuit receives and amplifies an input current $I_{in}$, and transfers the amplified current as a voltage signal $V_{out}$ to a next electronic element. The input current $I_{in}$ may be a signal transferred from a photodetector, which detects an optical signal, converts the optical signal into a current signal, and transfers the current signal to the cascode circuit. The photodetector may be a photodiode (PD). The transistor $M_{CS}$ is a current source supply transistor, and has a gate receiving a bias voltage $V_{BIAS}$ and a source connected to a ground voltage GND. The voltage signal $V_{out}$ is output from a node between the transistor M1 and the resistor $R_D$.

In the cascode circuit of FIG. 1, a drain node of the transistor $M_{CS}$ and an output node, as a drain, of the transistor M1 have a pole that decides a bandwidth. The bandwidth is relevant to a time constant ($\tau=RC$), and in the above structure, the two nodes have two poles $\omega_i$ and $\omega_1$, which may be expressed as Equation (1).

$$\begin{aligned}\omega_i &= \frac{1}{\tau_i} \\ &= \frac{1}{R_{in} \cdot C_{in}} \\ &\cong \frac{1}{\left(\frac{1}{g_{m1}}\right) \cdot (C_{PD} + C_{eqi})} \\ &= \frac{g_{m1}}{C_{PD} + C_{eqi}} \\ \omega_1 &= \frac{1}{\tau_i} \\ &= \frac{1}{R_{out} \cdot C_{out}} \\ &\cong \frac{1}{R_{D1} \cdot C_{eqo}}\end{aligned} \quad (1)$$

In Equation (1), there is a high possibility that the pole ($\omega_i$) instead of the pole ($\omega_1$) becomes a dominant pole. The reason is because a transconductance $g_{m1}$ of the transistor M1 is not large enough in a short channel CMOS process, and thus, a value of $1/g_{m1}$ is larger than $R_{D1}$, and a parasitic capacitance ($C_{PD}$) of a PD has a larger value than an input capacitance ($C_{eqi}$) or an output capacitance ($C_{eqo}$). Further, a drain-source resistance value of the current source supply transistor $M_{CS}$ is not large enough, and thus, a small signal input current $i_{in}$ may be leaked to the transistor $M_{CS}$.

Therefore, a regulated cascode common-gate circuit (RGC), which is modified by further advancing the common-gate structure of FIG. 1, is used for realizing better broadband.

Figure 2:
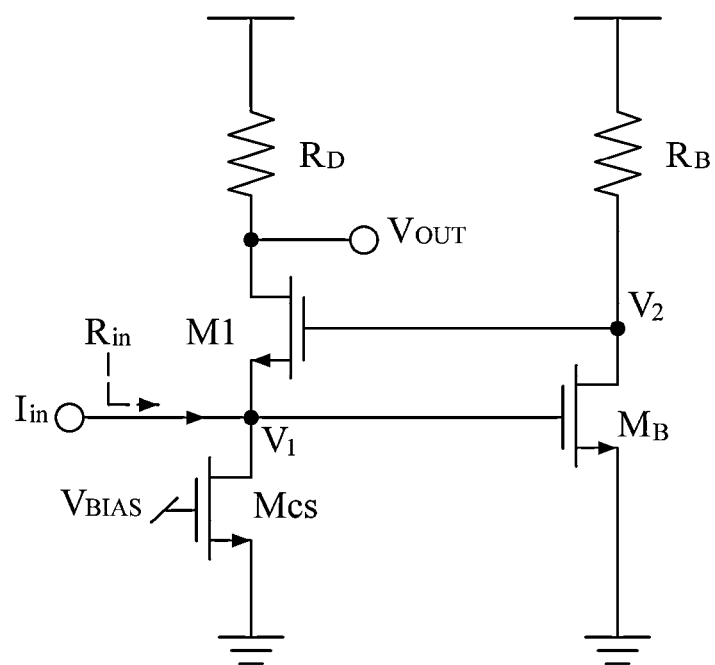
FIG. 2 is a circuit diagram illustrating a general RGC.

FIG. 2 is a circuit diagram illustrating a general RGC.

Referring to FIG. 2, an RGC structure is a type in which a negative feedback circuit is added to the common-gate structure described above with reference to FIG. 1. The greatest advantage of the RGC structure is in that an input resistance value is reduced due to a local feedback mechanism. Therefore, a capacitance-dependent characteristic of the PD is improved compared to the common-gate structure of FIG. 1. If an equation is rearranged on the assumption that a transistor $M_B$ and a resistor $R_B$ configure a negative amplifier A, a resistance value $R_{in}$ seen from an input side may be expressed as the following Equation 2.

$$R_{in} = \frac{V_1}{i_{in}} \qquad (2)$$
$$= \frac{V_1}{-g_{m2} \cdot V_{gs2}}$$
$$= \frac{V_1}{-g_{m2} \cdot (V_2 - V_1)}$$
$$= \frac{V_1}{-g_{m2} \cdot (A-1)V_1}$$
$$= \frac{1}{g_{m2} \cdot (1-A)}$$
$$= \frac{1}{g_{m2} \cdot (1 + g_{m1} \cdot R_2)}$$

where A is a voltage gain, which is $V_2/V_1$.

Referring to Equation (2), an input resistance decreases by an amplified value of a transconductance ($g_{m2}$) of the transistor $M_B$ which is amplified by the local feedback mechanism, and thus, a bandwidth limitation-dependent characteristic of a parasitic capacitance of the PD can be improved. However, to further improve a parasitic capacitance-dependent characteristic and secure a broader bandwidth, a circuit with lower input impedance is needed.

Therefore, the present invention proposes a first embodiment in which a bandwidth is enlarged by adding a negative feedback circuit (which provides a parallel resistor of a low value) to the general RGC structure of FIG. 2, a second embodiment in which the bandwidth and a noise characteristic are improved by adding an inductor to the general RGC structure of FIG. 2, and a third embodiment, which is realized by combining the first embodiment and the second embodiment. The first embodiment will be described with reference to FIGS. 3A to 3C, the second embodiment will be described with reference to FIGS. 4A to 4C, and the third embodiment will be described with reference to FIGS. 5A and 5B.

Figure 3A:
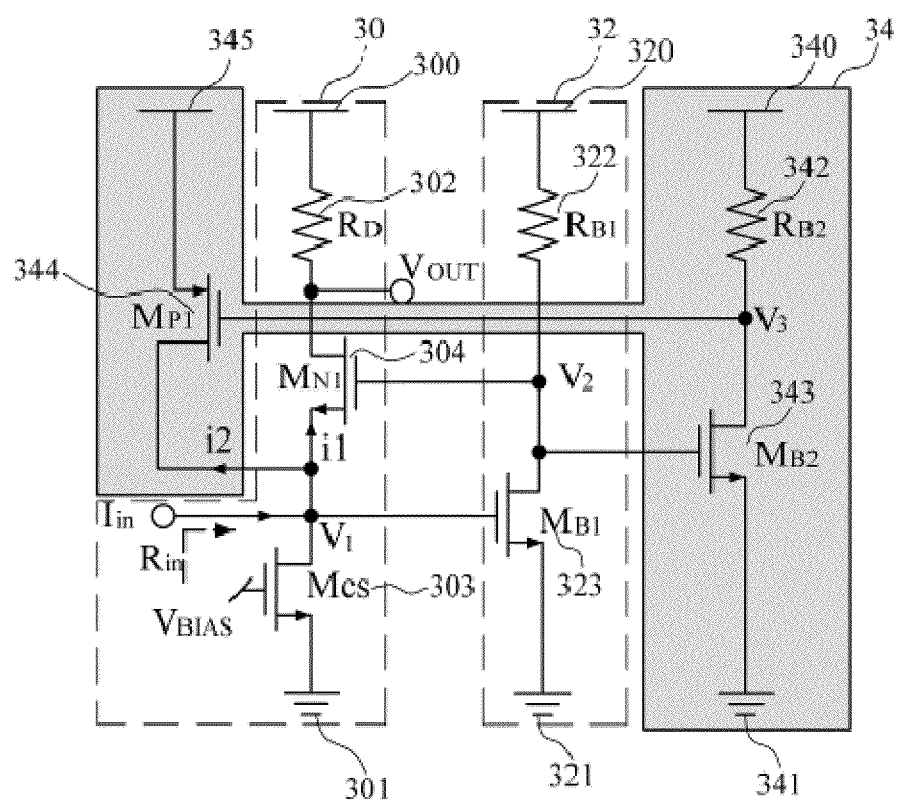
FIG. 3A is a circuit diagram illustrating an RGC type pre-amplifier with a low input impedance according to a first embodiment of the present invention.

FIG. 3A is a circuit diagram illustrating an RGC type pre-amplifier with a low input impedance according to a first embodiment of the present invention.

Referring to FIG. 3A, in the RGC type pre-amplifier according to the first embodiment, a negative feedback loop ($M_{B2}$, $R_{B2}$ and $M_{P1}$) is connected to an input node of the RGC structure of FIG. 2 in parallel. That is, in the RGC type pre-amplifier according to the first embodiment, a second feedback amplification unit 34 is added to a general RGC circuit including an amplification unit 30 and a first feedback amplification unit 32.

Hereinafter, a configuration of the RGC type pre-amplifier according to the first embodiment will be described. Referring to FIG. 3A, the RGC type pre-amplifier includes a regulated cascode circuit, including the amplification unit 30 and the first feedback amplification unit 32, and the second feedback amplification unit 34.

The amplification unit 30 amplifies an input current to generate an output voltage. The first feedback amplification unit 32 is connected to an input node of the amplification unit 30 and amplifies the input current to cause a negative feedback to the amplification unit 30. The second feedback amplification unit 34 receives and amplifies an output of the first feedback amplification unit 32 to again cause a positive feedback to an input node of the regulated cascode circuit, for reducing an input resistance of the regulated cascode circuit.

In detail, the amplification unit 30 of the regulated cascode circuit includes a first supply voltage 300, a first ground voltage 301, a first resistor ($R_D$) 302, a current source supply transistor ($M_{CS}$) 303, and a first NMOS transistor ($M_{N1}$) 304. The current source supply transistor ($M_{CS}$) 303 is connected between the first ground voltage 301 and an input node $V_1$ and has a gate to which a direct current (DC) voltage is applied. The first NMOS transistor ($M_{N1}$) 304 is connected between the input node $V_1$ and the first resistor ($R_D$) 302 and has a gate connected to an output of the first feedback amplification unit 32. The first resistor ($R_D$) 302 is connected between the drain node of the first NMOS transistor ($M_{N1}$) 304 and the first supply voltage 300. The current source supply transistor ($M_{CS}$) 303 may be a long channel and have applied thereto a DC voltage such that a constant current is supplied to the amplification unit 30 irrespective of a level of an input current.

The first feedback amplification unit 32 includes a second supply voltage 320, a second ground voltage 321, a second resistor ($R_{B1}$) 322, and a second NMOS transistor ($M_{B1}$) 323. The second NMOS transistor ($M_{B1}$) 323 is connected between the second ground voltage 321 and a node $V_2$ that is provided between the gate node of the first NMOS transistor ($M_{N1}$) 304 of the amplification unit 30 and the second resistor ($R_{B1}$) 322, and has a gate connected to the input node $V_1$ of the amplification unit 30. The second resistor ($R_{B1}$) 322 is provided between the second supply voltage 320 and the node $V_2$ that is provided between the first NMOS transistor ($M_{N1}$) 304 of the amplification unit 30 and the second NMOS transistor ($M_{B1}$) 323.

The second feedback amplification unit 34 includes a third supply voltage 340, a third ground voltage 341, a third resistor ($R_{B2}$) 342, a third NMOS transistor ($M_{B2}$) 343, a PMOS transistor ($M_{P1}$) 344, and a fourth supply voltage 345. The third NMOS transistor ($M_{B2}$) 343 is connected between the third ground voltage 341 and a node $V_3$ that is provided between the gate node of the PMOS transistor (MP1) 344 and the third resistor ($R_{B2}$) 342, and has a gate connected to an output of the first feedback amplification unit 32. The third resistor ($R_{B2}$) 342 is provided between the third supply voltage 340 and the node $V_3$ that is provided between the drain node of the third NMOS transistor ($M_{B2}$) 343 and the gate node of the PMOS transistor ($M_{P1}$) 344. The PMOS transistor ($M_{P1}$) 344 is provided between the input node of the amplification unit 30 (to drain) and the fourth supply voltage 345 (to source), and has a gate connected to the drain node of the third NMOS transistor ($M_{B2}$) 343.

An input resistance value of the RGC structure is generally a resistance value seen toward a source of the first NMOS transistor ($M_{N1}$) 304. According to an embodiment of the present invention, when a small signal $i_1$ is input to the source of the first NMOS transistor ($M_{N1}$) 304 and an input resistance value is calculated, it can be seen from Equation (2) that the input resistance value is inversely proportional to the product of a transconductance ($g_{m1}$) of the first NMOS transistor ($M_{N1}$) 304 and a gain ($g_{mB} \cdot R_{B1}$) of a negative local feedback amplifier A. The structure of FIG. 3A provides other parallel resistors through the negative feedback loop newly added to the RGC structure of FIG. 2.

Figure 3B:
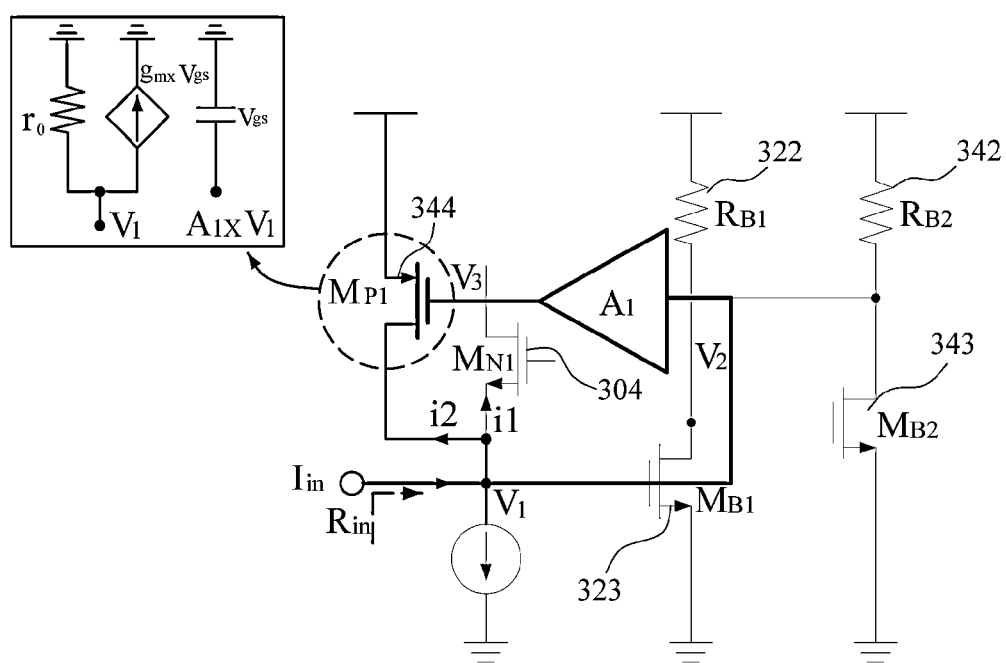
FIG. 3B is an equivalent circuit in which the circuit of FIG. 3A is simplified to be easily understood.

FIG. 3B is an equivalent circuit in which the circuit of FIG. 3A is simplified to be easily understood.

Referring to FIGS. 3A and 3B, the conventional RGC structure configured with the first resistor ($R_D$) 302, the first NMOS transistor ($M_{N1}$) 304, the second resistor ($R_{B1}$) 322, and the second NMOS transistor ($M_{B1}$) 323, and the cascade negative amplifier configured with the third resistor ($R_{B2}$) 342, the third NMOS transistor ($M_{B2}$) 343 can be simplified as a positive amplifier $A_1$, and the following PMOS transistor ($M_{P1}$) 344 amplifies the output of A1 and feedback to the input node. The cascade negative amplifier and the PMOS transistor 34 are added according to the present invention. A combination of the second resistor ($R_{B1}$) 322 and second NMOS transistor ($M_{B1}$) 323 of the first feedback amplification unit 32 is equivalent to a negative amplifier with an amplification gain A, and a combination of the third resistor ($R_{B2}$) 342, third NMOS transistor ($M_{B2}$) 343, and PMOS transistor ($M_{P1}$) 344 of the second cascade local feedback amplification unit 34 is equivalent to a positive amplifier with an amplification gain A'. As a result, a combination of the first negative feedback amplification unit 32 and the second positive feedback amplification unit 34 is equivalent to a negative amplifier with an amplification gain $A_1$.

An input resistance seen from an input node with a small signal i2 will be calculated as follows:

First, as illustrated in FIG. 3B, the PMOS transistor ($M_{P1}$) 344 may be illustrated as a small signal equivalent circuit, and when a channel length modulation resistance $r_0$ that is a relatively large value is ignored, the small signal i2 may be approximately equal to $g_{m\_MP1} \cdot V_{gs\_MP1}$. Here, $V_{gs\_MP1}$ is a small signal of the node $V_3$, and a voltage of the node $V_3$ is a signal that is amplified by the gain $A_1$ of the positive amplifier. When this is rearranged as expressed in Equation (3), a resistance value $R_{in2}$ seen in the newly added feedback circuit $M_{P1}$ may be calculated.

$$R_{in2} = \frac{V_1}{i_2} \quad (3)$$

$$= \frac{V_1}{g_{m\_MP1} \cdot V_{gs\_MP1}}$$

$$= \frac{V_1}{g_{m\_MP1} \cdot (V_3)}$$

$$= \frac{V_1}{g_{m\_MP1} \cdot A_1 V_1}$$

$$= \frac{1}{g_{m\_MP1} \cdot A_1}$$

where $A_1$ is a positive gain equal to $(g_{m\_MB1} \cdot R_{B1}) \times (g_{m\_MB2} \cdot R_{B2})$. The resistance value $R_{in2}$ is parallel to a resistance value $R_{in1}$ seen by a small signal current $i_1$ in the following Equation (4).

$$R_{in1} = \frac{1}{g_{m2} \cdot (1 - A)} \quad (4)$$

$$= \frac{1}{g_{m2} \cdot (1 + g_{m\_MB1} \cdot R_B)}$$

Therefore, a value $R_{in}$ is expressed as Equation (5).

$$R_{in} = R_{in1} // R_{in2} \quad (5)$$

$$= \left[\frac{1}{g_{m2} \cdot (1-A)}\right] // \left[\frac{1}{g_{m\_MP1} \cdot A_1}\right]$$

In Equation (5), a value $g_{m\_MP1}$ of the PMOS transistor ($M_{P1}$) 344 is smaller than a value $g_{m2}$, but since the gain value $A_1$ of the amplifier $A_1$ is larger than the gain value A, the value $g_{m\_MP1}$ and the value $g_{m2}$ may be of similar order by adjusting a value. For example, when the resistance value $R_{in2}$ and the resistance value $R_{in1}$ are adjusted to the same value, an input resistance value of the structure proposed with reference to FIG. 3A may be reduced by half of that of the existing RGC structure. In a parallel negative feedback loop structure proposed, a conversion gain decreases, and thus, in consideration of the tradeoff between gain and bandwidth, the resistance value $R_{in2}$ should be greater than the resistance value $R_{in1}$.

Figure 3C:
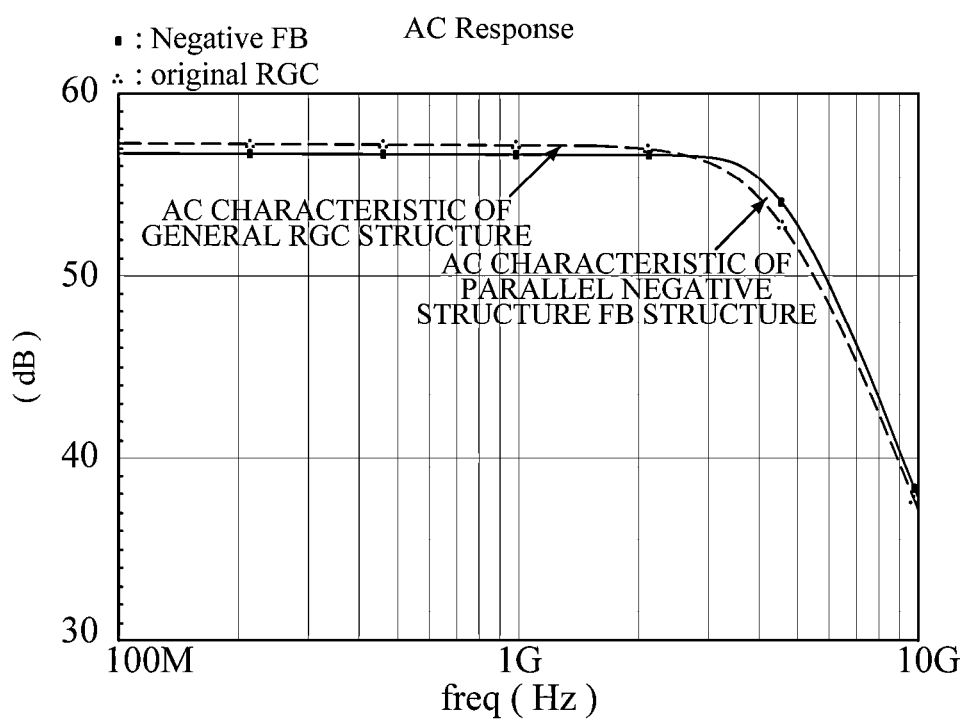
FIG. 3C is a reference diagram showing simulation results of a frequency characteristic of a structure according to the first embodiment of the present invention.

FIG. 3C is a reference diagram showing simulation results of a frequency characteristic of a structure according to the first embodiment of the present invention.

Referring to FIG. 3C, it can be seen that the conversion gain of the structure of the first embodiment, which has been described above with reference to FIGS. 3A and 3B, is slightly reduced compared to the general RGC structure, but the bandwidth of the structure of the first embodiment is wider than that of the general RGC structure. That is, it can be seen through FIG. 3C that the feedback loop structure according to the first embodiment can attenuate an input resistance value.

Further, in the structure according to the first embodiment, an input referred noise current can increase because a parallel circuit is added to the input node of the general RGC structure, but since a two-stage amplification gain $A_1$ has a relatively large value, the PMOS transistor ($M_{P1}$) 344 can have a small value $g_{m\_MP1}$. Therefore, when the PMOS transistor ($M_{P1}$) 344 has a large resistance value by adjusting a width/length ratio (W/L), deterioration caused by a noise can be prevented.

Generally, in a TIA configured with an amplifier and a feedback resistor, an input resistance is reduced by decreasing a feedback resistance for broadening a bandwidth. In this case, thermal noise increases, causing degradation of system sensitivity. The structure according to the first embodiment can be adjusted such that noise is reduced, and noise effects are minimized.

Figure 4A:
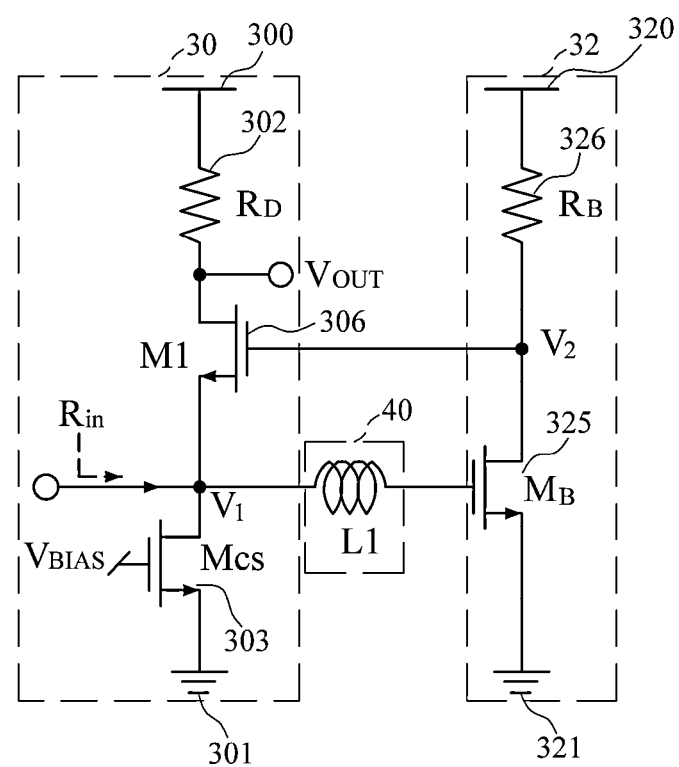
FIG. 4A is a circuit diagram illustrating an RGC type pre-amplifier with a low input impedance according to a second embodiment of the present invention.

FIG. 4A is a circuit diagram illustrating an RGC type pre-amplifier with a low input impedance according to a second embodiment of the present invention.

If the structure described above with reference to FIG. 3A is a method that decreases the input resistance value $R_{in}$, a structure, which will be described below with reference to FIG. 4A, is a method that reduces an input capacitance value $C_{in}$. The structure according to the second embodiment is a structure in which an inductor (L1) 40 is serially connected between an input node and a gate of an NMOS transistor $M_B$, in the general RGC structure. That is, the structure according to the second embodiment is a structure in which the inductor (L1) 40 is added to a general RGC circuit, including the amplification unit 30 and the first feedback amplification unit 32.

The input capacitance $C_{in}$ in the RGC structure is a value obtained by adding all parasitic capacitance values of a pad, an ESD circuit, and a transistor (connected to an input node)

to a parasitic capacitance of a PD in parallel. Since the input capacitance $C_{in}$ is a parameter of a time constant that decides the bandwidth, an equivalent capacitance value of the input capacitance should be smaller. The greatest input capacitance value in the node $V_1$ of the conventional RGC structure corresponding to the TIA is a gate-source capacitance and gate-drain capacitance of an NMOS transistor $M_B$, which transistor normally has very large W/L for getting high $g_m$. The added inductor (L1) 40 isolates a capacitance value increased by the NMOS transistor $M_B$ from input node.

Hereinafter, a configuration of the RGC type pre-amplifier according to the second embodiment will be described. Referring to FIG. 4A, the RGC type pre-amplifier includes a regulated cascode circuit that includes an amplification unit 30 and a first feedback amplification unit 32, and the inductor (L1) 40.

The amplification unit 30 amplifies an input current to generate an output voltage. The first feedback amplification unit 32 is connected to an input node of the amplification unit 30 and amplifies the input current to cause a negative feedback to the amplification unit 30. The inductor (L1) 40 is serially connected between an input node of the amplification unit 30 and an input node of the first feedback amplification unit 32 so as to reduce an input capacitance of the regulated cascode circuit.

In detail, the amplification unit 30 of the regulated cascode circuit includes a first supply voltage 300, a first ground voltage 301, a first resistor ($R_D$) 302, a current source supply transistor ($M_{CS}$) 303, and a first NMOS transistor (M1) 306. The current source supply transistor ($M_{CS}$) 303 is connected between the first ground voltage 301 and an input node $V_1$, and has a gate to which a DC voltage is applied. The first NMOS transistor (M1) 306 is connected between the input node and the first resistor ($R_D$) 302, and has a gate connected to an output of the first feedback amplification unit 32. The first resistor ($R_D$) 302 is connected between the first NMOS transistor (M1) 306 and the first supply voltage 300. The current source supply transistor ($M_{CS}$) 303 may be a long channel and have applied thereto a DC voltage such that a constant current is supplied to the amplification unit 30 irrespective of a level of an input current.

The first feedback amplification unit 32 includes a second supply voltage 320, a second ground voltage 321, a second NMOS transistor ($M_B$) 325, and a second resistor ($R_B$) 326. The second NMOS transistor ($M_B$) 325 is connected the second ground voltage 321 to the source node and the second resistor ($R_B$) 326 to the drain node, and has a gate connected to the input node of the amplification unit 30 with serial inductor (L1) 40. The second resistor ($R_B$) 322 is provided between the second supply voltage 320 and the node that is provided between the first NMOS transistor (M1) 306 of the amplification unit 30 and the second NMOS transistor ($M_B$) 325.

Figure 4B:
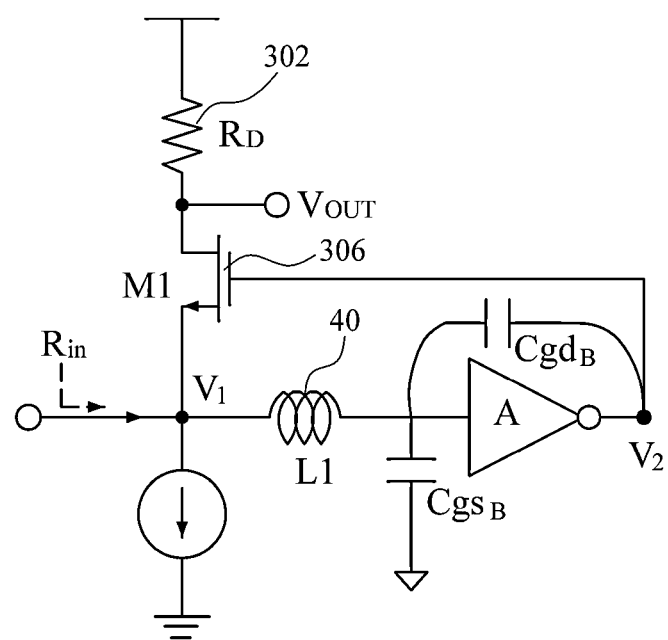
FIG. 4B is an equivalent circuit in which the circuit of FIG. 4A is simplified to be easily understood.

FIG. 4B is an equivalent circuit in which the circuit of FIG. 4A is simplified to be easily understood.

Referring to FIGS. 4A and 4B, parasitic capacitors seen in a gate of the second NMOS transistor ($M_B$) 325 are capacitors $Cgs_B$ and $Cgd_B$. A capacitance value of the capacitor $Cgd_B$ connected between the gate and a drain node of the second NMOS transistor ($M_B$) 325 is increased due to the Miller effect. Cgd_miller is $Cgd_B(1-A)$ and A is a negative value. Therefore, a capacitance value $C_{eq\_MB}$ seen in the gate of second NMOS transistor ($M_B$) 325 has a greater value due to an amplifier effect. The capacitance value $C_{eq\_MB}$ is expressed as the following Equation (6).

$$C_{eq\_MB} = C_{gs\_MB} + C_{gd\_miller} \quad (6)$$

Therefore, the added inductor (L1) 40 separates a parasitic capacitor of a large value from the input node at a high frequency. That is, the added inductor (L1) 40 performs the operation characteristic of a general regulator as a short line at a low frequency, and decreases an input capacitance to broaden a bandwidth as an open line at the high frequency that decides the bandwidth. The added inductor (L1) 40 adjusts a serial resonance point to a bandwidth of 3 dB, and thus does not have a high inductance value.

Figure 4C:
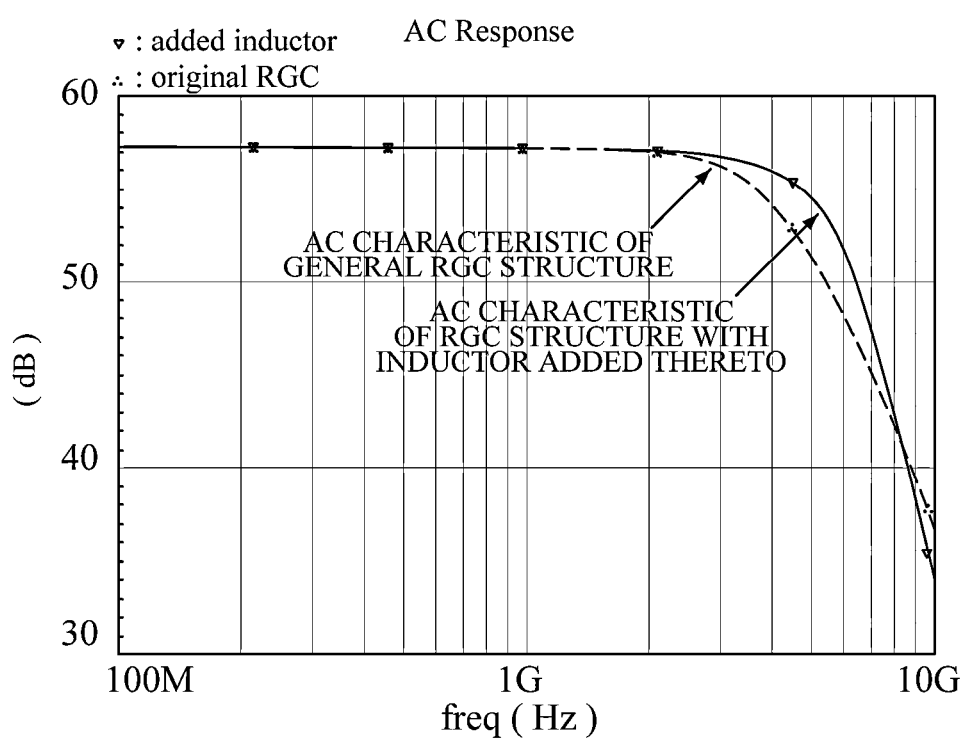
FIG. 4C is a reference diagram showing simulation results of a frequency characteristic of a structure according to the second embodiment of the present invention.

FIG. 4C is a reference diagram showing simulation results of a frequency characteristic of a structure according to the second embodiment of the present invention.

Referring to FIG. 4C, it can be seen that the RGC structure with the inductor added thereto according to the second embodiment can easily broaden a bandwidth without a gain being attenuated, in comparison with the general RGC structure.

Figure 5A:
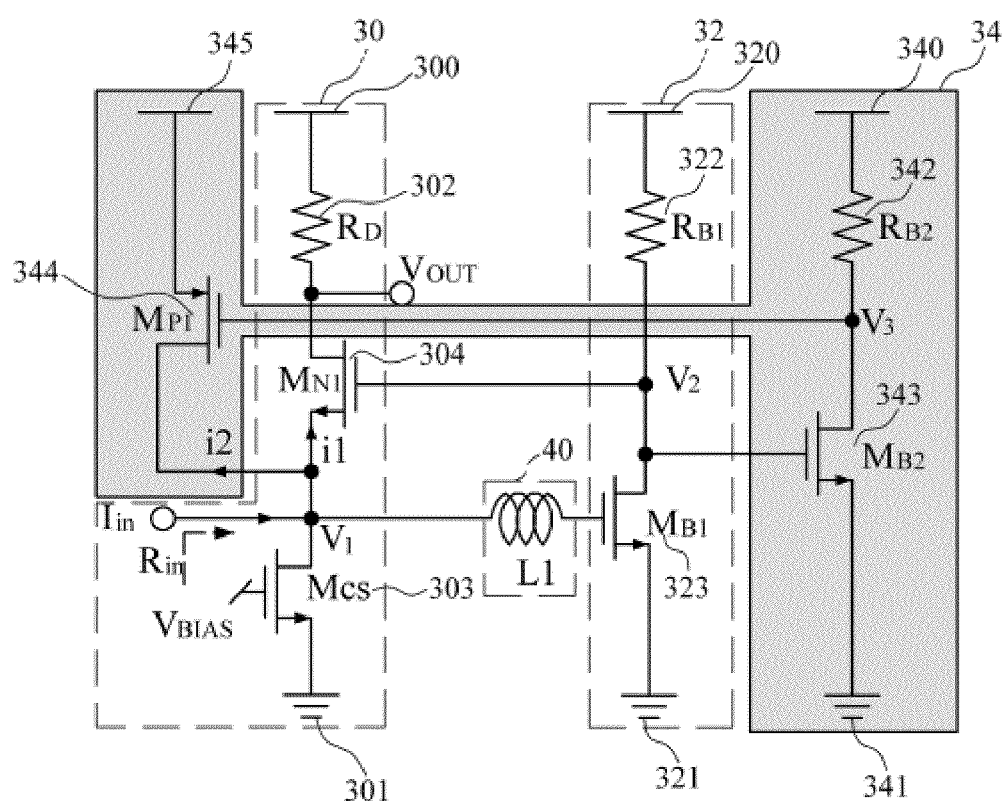
FIG. 5A is a circuit diagram illustrating an RGC type pre-amplifier with a low input impedance according to a third embodiment of the present invention.

FIG. 5A is a circuit diagram illustrating an RGC type pre-amplifier with a low input impedance according to a third embodiment of the present invention.

The structure according to the third embodiment of FIG. 5A is a structure that includes all the circuit structures described above with reference to FIGS. 3A and 4A. That is, in the structure according to the third embodiment, a second feedback amplification unit 34 and an inductor (L1) 40 are added to the general RGC circuit including an amplification unit 30 and a first feedback amplification unit 32.

Hereinafter, a configuration of the RGC type pre-amplifier according to the third embodiment will be described. Referring to FIG. 5A, the RGC type pre-amplifier includes a regulated cascode circuit including the amplification unit 30 and the first feedback amplification unit 32, the second feedback amplification unit 34, and the inductor (L1) 40.

The amplification unit 30 amplifies an input current to generate an output voltage. The first feedback amplification unit 32 is connected to the signal of an input node of the amplification unit 30 and amplifies the input current to cause a negative feedback to the amplification unit 30. The second feedback amplification unit 34 receives and amplifies an output of the first feedback amplification unit 32 to again cause a positive feedback to an input node of the regulated cascode circuit, in an effort to reduce an input resistance of the regulated cascode circuit. The inductor (L1) 40 is serially connected between an input node of the amplification unit 30 and an input node of the first feedback amplification unit 32.

In detail, the amplification unit 30 of the regulated cascode circuit includes a first supply voltage 300, a first ground voltage 301, a first resistor ($R_D$) 302, a current source supply transistor ($M_{CS}$) 303, and a first NMOS transistor ($M_{N1}$) 304. The current source supply transistor ($M_{CS}$) 303 is connected between the first ground voltage 301 and an input node $V_1$, and has a gate receiving a DC voltage. The first NMOS transistor ($M_{N1}$) 304 is connected between the input node $V_1$ and the first resistor ($R_D$) 302, and has a gate connected to an output of the first feedback amplification unit 32. The first resistor ($R_D$) 302 is connected between the first NMOS transistor ($M_{N1}$) 304 and the first supply voltage 300. The current source supply transistor ($M_{CS}$) 303 may be a long channel, and have applied thereto a DC voltage such that a constant current is supplied to the amplification unit 30 irrespective of a level of an input current.

The first feedback amplification unit 32 includes a second supply voltage 320, a second ground voltage 321, a second resistor ($R_{B1}$) 322, and a second NMOS transistor ($M_{B1}$) 323. The second NMOS transistor ($M_{B1}$) 323 is connected between the second ground voltage 321 and a node $V_2$ that is provided between the first NMOS transistor ($M_{N1}$) 304 of the amplification unit 30 and the second resistor ($R_{B1}$) 322 and has a gate connected to the input node $V_1$ of the amplification unit 30. The second resistor ($R_{B1}$) 322 is provided between the second supply voltage 320 and the node $V_2$ that is provided between the first NMOS transistor ($M_{N1}$) 304 of the amplification unit 30 and the second NMOS transistor ($M_{B1}$) 323.

The second feedback amplification unit 34 includes a third supply voltage 340, a third ground voltage 341, a third resistor ($R_{B2}$) 342, a third NMOS transistor ($M_{B2}$) 343, a PMOS transistor ($M_{P1}$) 344, and a fourth supply voltage 345.

The third NMOS transistor ($M_{B2}$) 343 is connected between the third ground voltage 341 and a node $V_3$ that is provided between the PMOS transistor ($M_{P1}$) 344 and the third resistor ($R_{B2}$) 342 and has a gate connected to an output of the first feedback amplification unit 32. The third resistor ($R_{B2}$) 342 is provided between the third supply voltage 340 and the node $V_3$ that is provided between the third NMOS transistor ($M_{B2}$) 343 and the PMOS transistor ($M_{P1}$) 344. The PMOS transistor ($M_{P1}$) 344 is provided between the input node of the amplification unit 30 and the fourth supply voltage 345, and has a gate connected to the third NMOS transistor ($M_{B2}$) 343.

The inductor (L1) 40 is serially connected between an input node of the amplification unit 30 and an input node of the first feedback amplification unit 32 so as to reduce an input resistance of the regulated cascode circuit.

In this case, as described above with reference to FIGS. 3A and 4A, in order to attenuate the input impedance that decides a bandwidth, an input resistance value is offset by the parallel negative feedback circuit and an input capacitance is offset by the added inductor.

In detail, according to the third embodiment, although the acceleration of the parallel negative feedback loop triggers additional power consumption compared to the general RGC structure, the structure according to the third embodiment has the advantage of easily broadening a bandwidth by decreasing an input resistance value of the general RGC structure. Also, since the structure according to the third embodiment uses the inductor, the structure according to the third embodiment additionally occupies an area that is not occupied by the general RGC structure, but the structure according to the third embodiment can easily broaden the bandwidth by decreasing an input capacitance of the general RGC structure.

The third embodiment of FIG. 5A can prevent the bottleneck that affects the bandwidth of an entire optical system at the input node of the TIA. Further, because a current value is fixed by the transistor $M_{CS}$ that supplies a source current, and each bias point is stabilized by the RGC structure, the circuit structure as a whole, according to the third embodiment, has a stabilized operating characteristic. Also, due to the simple configuration of each stage, less voltage headroom is occupied, making low-voltage operation possible.

Figure 5B:
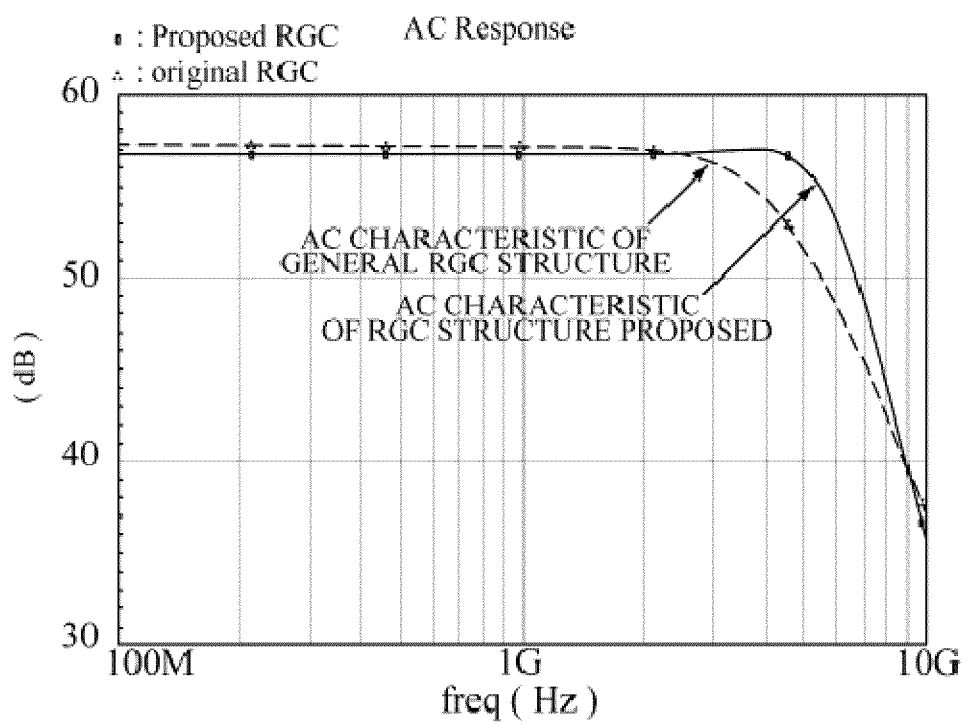
FIG. 5B is a reference diagram showing simulation results of a frequency characteristic of a structure according to the third embodiment of the present invention.

FIG. 5B is a reference diagram showing simulation results of a frequency characteristic of a structure according to the third embodiment of the present invention.

Referring to FIG. 5B, it can be seen that the conversion gain of the structure of the third embodiment is slightly reduced compared to the general RGC structure, but the bandwidth of the structure of the third embodiment is wider than that of the general RGC structure.

According to the embodiments of the present invention, bandwidth limitation due to parasitic capacitance of the PD in the input end of the TIA is overcome, and thus, broad and stable operation of broadband unaffected by bandwidth can be ensured. That is, a feedback circuit is added to the general RGC structure to be connected in parallel, so that an input resistance value is reduced to easily broaden the bandwidth. Also, an inductor is added to the general RGC structure so that an input capacitance is reduced to easily broaden the bandwidth. In addition, current consumption and an occupied area are not large, and noise effects can be prevented by adjusting a size.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A transimpedance pre-amplifier (TIA) comprising:
   a regulated cascode circuit configured to include an amplification unit that amplifies an input current to generate an output voltage, and a first feedback amplification unit that is connected to an input node of the amplification unit and amplifies the input current to cause a negative feedback to the amplification unit; and
   a second feedback amplification unit configured to amplify an output of the first feedback amplification unit and to provide a positive feedback to an input node of the regulated cascode circuit, for reducing an input resistance of the regulated cascode circuit.

2. The TIA of claim 1, wherein the amplification unit of the regulated cascode circuit comprises:
   a current source supply transistor configured to have a source connected to a first ground voltage, a drain connected to an input node, and a gate to which a DC voltage is applied;
   a first NMOS transistor configured to have a source connected to the input node, a drain connected to a first resistor, and a gate connected to an output of the first feedback amplification unit; and
   wherein the first resistor is connected between the drain of the first NMOS transistor and the first supply voltage.

3. The TIA of claim 2, wherein the first feedback amplification unit comprises:
   a second NMOS transistor configured to have a source connected to a second ground voltage, a drain connected to a node that is provided between a gate of the first NMOS transistor of the amplification unit and a second resistor, and a gate connected to the input node of the first feedback amplification unit; and
   wherein the second resistor is provided between a second supply voltage and a node that is provided between the gate of the first NMOS transistor of the amplification unit and the drain of the second NMOS transistor.

4. The TIA of claim 3, wherein a combination of the second NMOS transistor and the second resistor of the first feedback amplification unit is equivalent to a negative amplifier with an amplification gain A.

5. The TIA of claim 1, wherein the second feedback amplification unit comprises:
   a third NMOS transistor configured to have a source connected to a third ground voltage, a drain connected to a node that is provided between a gate of a PMOS transistor and a third resistor, and a gate connected to an output of the first feedback amplification unit;
   wherein the third resistor is provided between a third supply voltage and a node that is provided between the drain of the third NMOS transistor and a gate of the PMOS transistor; and the PMOS transistor is configured to have a source connected to a fourth supply voltage, a drain connected the input node of the amplification unit, and a gate connected to a node that is provided between the drain of the third NMOS transistor and the third resistor.

6. The TIA of claim 5, wherein a combination of the third NMOS transistor, third resistor, and PMOS transistor of the second feedback amplification unit is equivalent to a positive amplifier with an amplification gain A'.

7. The TIA of claim 1, wherein a combination of the first feedback amplification unit and the second amplification unit is equivalent to a negative amplifier with a gain $A_2$.

8. The TIA of claim 2, wherein the current source supply transistor is a long channel and has applied thereto a DC voltage such that a constant current is supplied to the amplification unit irrespective of a level of an input current.

9. A transimpedance pre-amplifier (TIA) comprising:
a regulated cascode circuit configured to comprise an amplification unit that amplifies an input current to generate an output voltage, and a first feedback amplification unit that is connected to an input node of the amplification unit and amplifies the input current to cause a negative feedback to the amplification unit; and
an inductor serially connected between an input node of the amplification unit and an input node of the first feedback amplification unit, for reducing an input resistance of the regulated cascode circuit;
wherein the amplification unit of the regulated cascode circuit comprises:
a current source supply transistor configured to have a source connected to a first ground voltage, a drain connected to an input node, and a gate to which a DC voltage is applied.

10. The TIA of claim 9, wherein the amplification unit of the regulated cascode circuit further comprises:
a first NMOS transistor configured to have a source connected to the input node, a drain connected to a first resistor, and a gate connected to an output of the first feedback amplification unit; and
wherein the first resistor is connected between the drain of the first NMOS transistor and the first supply voltage.

11. The TIA of claim 10, wherein the first feedback amplification unit comprises:
a second NMOS transistor configured to have a source connected to a second ground voltage, a drain connected to a node between the gate of the first NMOS transistor of the amplification unit and a second resistor, and a gate connected to the input node of the first feedback amplification unit; and
wherein the second resistor is provided between a second supply voltage and a node that is provided between the gate of the first NMOS transistor of the amplification unit and the drain of the second NMOS transistor.

12. The TIA of claim 10, wherein the current source supply transistor is a long channel and has applied thereto a DC voltage such that a constant current is supplied to the amplification unit irrespective of a level of an input current.

13. The TIA of claim 9, further comprising:
a photodetector configured to detect an optical signal, convert the optical signal into a current signal, and supply an input current to the amplification unit.

14. A transimpedance pre-amplifier (TIA) comprising:
a regulated cascode circuit configured to include an amplification unit that amplifies an input current to generate an output voltage, and a first feedback amplification unit that is connected to an input node of the amplification unit and amplifies the input current to cause a negative feedback to the amplification unit;
a second feedback amplification unit configured to receive and amplify an output of the first feedback amplification unit to again cause a positive feedback to an input node of the regulated cascode circuit, for reducing an input resistance of the regulated cascode circuit; and
an inductor serially connected between an input node of the amplification unit and an input node of the first feedback amplification unit, for reducing an input resistance of the regulated cascode circuit.

15. The TIA of claim 14, wherein the amplification unit of the regulated cascode circuit comprises:
a current source supply transistor configured to have a source connected to a first ground voltage, a drain connected to an input node, and a gate to which a DC voltage is applied;
a first NMOS transistor configured to have a source connected to the input node, a drain connected to a first resistor, and a gate connected to an output of the first feedback amplification unit; and
wherein the first resistor is connected between the drain of the first NMOS transistor and the first supply voltage.

16. The TIA of claim 15, wherein the first feedback amplification unit comprises:
a second NMOS transistor configured to have a source connected to a second ground voltage, a drain connected to a node between the gate of the first NMOS transistor of the amplification unit and a second resistor, and a gate connected to the input node of the amplification unit; and
wherein the second resistor is provided between a second supply voltage and a node that is provided between the gate of the first NMOS transistor of the amplification unit and the drain of the second NMOS transistor.

17. The TIA of claim 14, wherein the second feedback amplification unit comprises:
a third NMOS transistor configured to have a source connected to a third ground voltage, a drain connected to a node between a gate of a PMOS transistor and a third resistor, and a gate connected to an output of the first feedback amplification unit;
wherein the third resistor is provided between a third supply voltage and a node that is provided between the drain of the third NMOS transistor and the gate of the PMOS transistor; and
wherein the PMOS transistor is configured to have a source connected to a fourth supply voltage, a drain connected to the input node of the amplification unit, and a gate connected to a node that is provided between the drain of the third NMOS transistor and the third resistor.

* * * * *